United States Patent
Chu et al.

(10) Patent No.: US 8,283,809 B2
(45) Date of Patent: Oct. 9, 2012

(54) DETECTING DEVICE FOR DETECTING AN OPERATING MODE OF A SYSTEM AND DETECTING METHOD THEREOF

(75) Inventors: Yi-Shan Chu, Hsin-Chu (TW); Hsing-Kuo Chao, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 1001 days.

(21) Appl. No.: 12/249,965

(22) Filed: Oct. 13, 2008

(65) Prior Publication Data

US 2009/0271135 A1 Oct. 29, 2009

(30) Foreign Application Priority Data

Apr. 25, 2008 (TW) .............................. 97115474 A (51) Int. Cl.
*G01R 29/02* (2006.01)
*H03K 19/00* (2006.01)
(52) U.S. Cl. .................... 307/134; 307/115; 307/116
(58) Field of Classification Search .................. 327/276; 361/195; 307/134, 141.4, 115, 116, 141
See application file for complete search history.

(56) References Cited

U.S. PATENT DOCUMENTS

| | | | | |
|---|---|---|---|---|
| 4,385,204 A | * | 5/1983 | Wine | 381/109 |
| 5,122,647 A | * | 6/1992 | Lynam et al. | 250/201.1 |
| 5,278,489 A | * | 1/1994 | Bowers | 323/225 |
| 2002/0180412 A1 | * | 12/2002 | Yi | 323/283 |

FOREIGN PATENT DOCUMENTS

JP  03003807 A * 1/1991

OTHER PUBLICATIONS

CN101577792A, Zhao et al., Publication date Nov. 11, 2009.*

* cited by examiner

*Primary Examiner* — Fritz M Fleming
(74) *Attorney, Agent, or Firm* — Winston Hsu; Scott Margo (57) ABSTRACT

A detecting device for detecting an operating mode is disclosed. The detecting device includes a pulse generator and a hold-up unit. The pulse generator is disposed for issuing a one-shot pulse signal in response to each of button signals respectively. The hold-up unit is disposed for receiving the button signals to respectively generate delayed button signals by way of clock delay determined by a clock signal. The one-shot pulse signal and the delayed button signals are used to determine an operating mode of a system.

14 Claims, 8 Drawing Sheets

DETECTING DEVICE FOR DETECTING AN OPERATING MODE OF A SYSTEM AND DETECTING METHOD THEREOF

BACKGROUND OF THE INVENTION

1. Field of the Invention

The present invention relates to a detecting device for detecting operating modes, and more particularly, to a detecting device utilizing a hold-up unit for delaying button signals of a system in order to detect the operating mode of the system.

2. Description of the Prior Art

Digital cameras have become consumer electronic products nowadays. Different from conventional cameras, there are various operation statuses or modes for a digital camera, such like, for example, Power-ON status, Power-OFF status, Preview mode, Playback mode, universal serial bus (USB) in status, etc. Therefore, it is necessary for a digital camera system to detect the current status and mode to perform correctly.

Figure 1A:
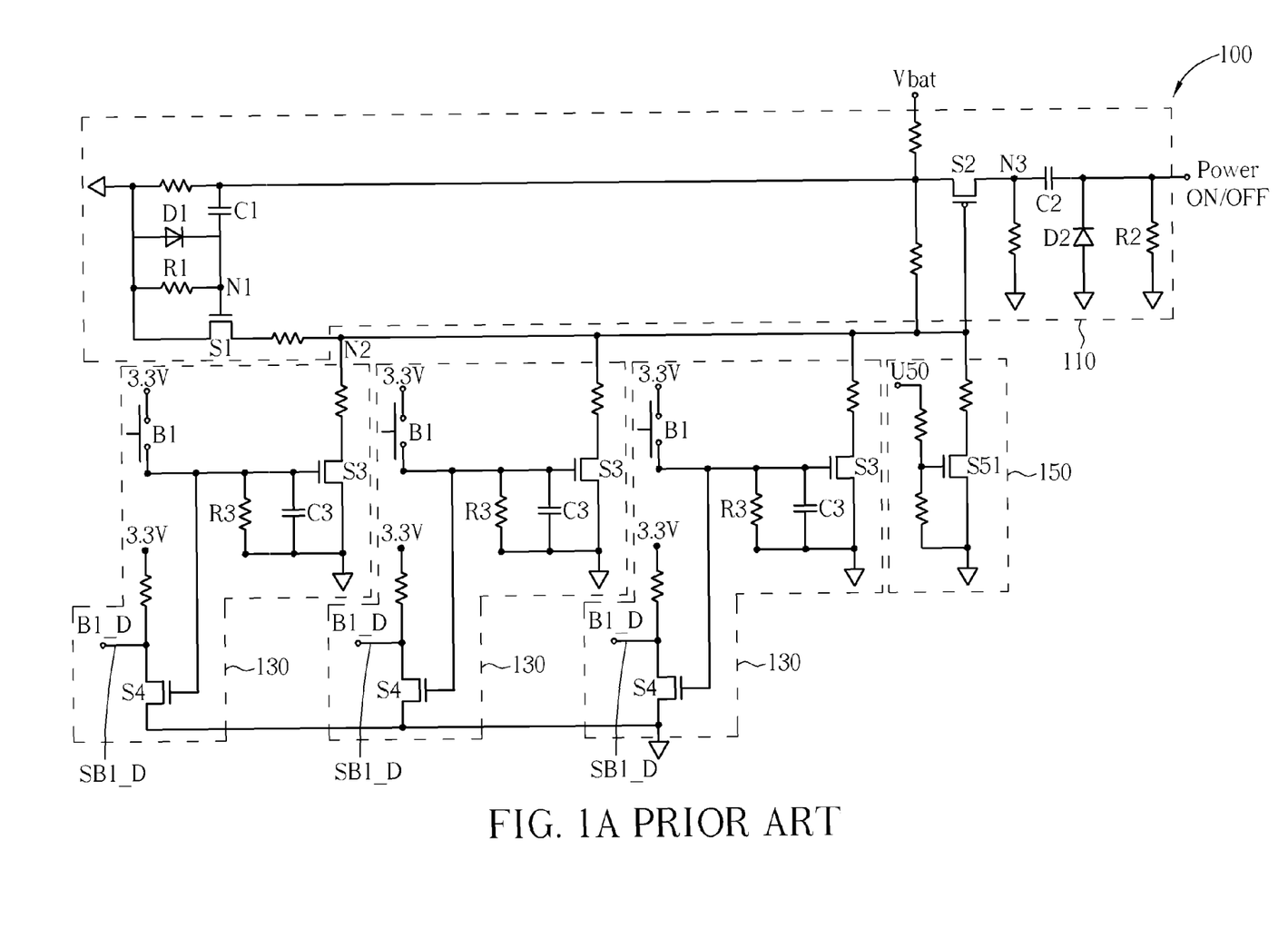
FIG. 1A is a circuit diagram of the conventional detecting device for detecting the operation mode in the prior art.

Please refer to FIG. 1A, a circuit diagram of a detecting circuit 100 applied in a digital camera for detecting the operating mode of the digital camera in the prior art. Detecting circuit 100 includes a pulse generator 110, button detecting circuits 130, and a peripheral device detecting circuit 150. The structures, connections and the operations of the components above are illustrated as below.

When a battery installed in the camera, the voltage of the battery, Vbat, is first filtered by the high-pass filter composed by capacitor C1 and resister R1. A one-shot pulse signal is generated at node N1 then. The peak voltage of the one-shot pulse signal equals to the battery voltage, Vbat. Therefore, when the amplitude of the one-shot pulse signal exceeds the threshold voltage of switch S1, switch S1 is turned on. Consequently, the voltage level at node N2 is pulled down to turn on switch S2. When switch S2 is turned on, the voltage at node N3 starts rising. The high-pass filter composed by capacitor C2 and resister R2 then outputs a one-shot pulse signal to pin Power_ON/OFF.

Some digital cameras further deal with the one-shot pulse signal to complete the power-on procedure. For example, this one-shot pulse signal received from pin Power_ON/OFF may be further transmitted to the digital signal processor of the camera system. When receiving the pulse signal, the digital signal processor may turns on a multi-channel power converter to generate voltage sources with different voltages, such as a 3.3V voltage.

Usually, operation buttons, such like a switch button for turning on/off the camera, a preview button for previewing the taken photos and a playback button for recording and playing videos, are set on the camera case of a digital camera. As shown in FIG. 1, button detecting circuits 130 are installed correspondingly to operation buttons. Besides, a connecting interface for peripheral devices, for instance, a universal serial bus (USB), is usually set in the digital camera as well in order to connect to external storage devices.

When a camera finishes the power-on procedure, one switch S3 and one switch S4 are turned on if one button B1 of the camera is triggered. The voltage level at node N2 is accordingly pulled down then. Switch S2 is turned on again, such that pin Power_ON/OFF again outputs a one-shot pulse signal, and a detecting pin B1_D, which is corresponding to button B1, outputs a signal reverse to the signal triggering the pin. The firmware of the digital camera system would enter an operating mode or status, for example, the power-on status, the power-off status, the preview mode, the playback mode, etc., according to the pulse signal output by pin Power_ON/OFF and the output signal of the detecting pin.

If there is a peripheral device connected to the USB interface of the system, input U50 of detecting circuit 150 receives a signal at logic high level. Switch S51 is turned on in accordance, and pin Power_ON/OFF outputs a one-shot pulse signal as well.

Figure 1B:
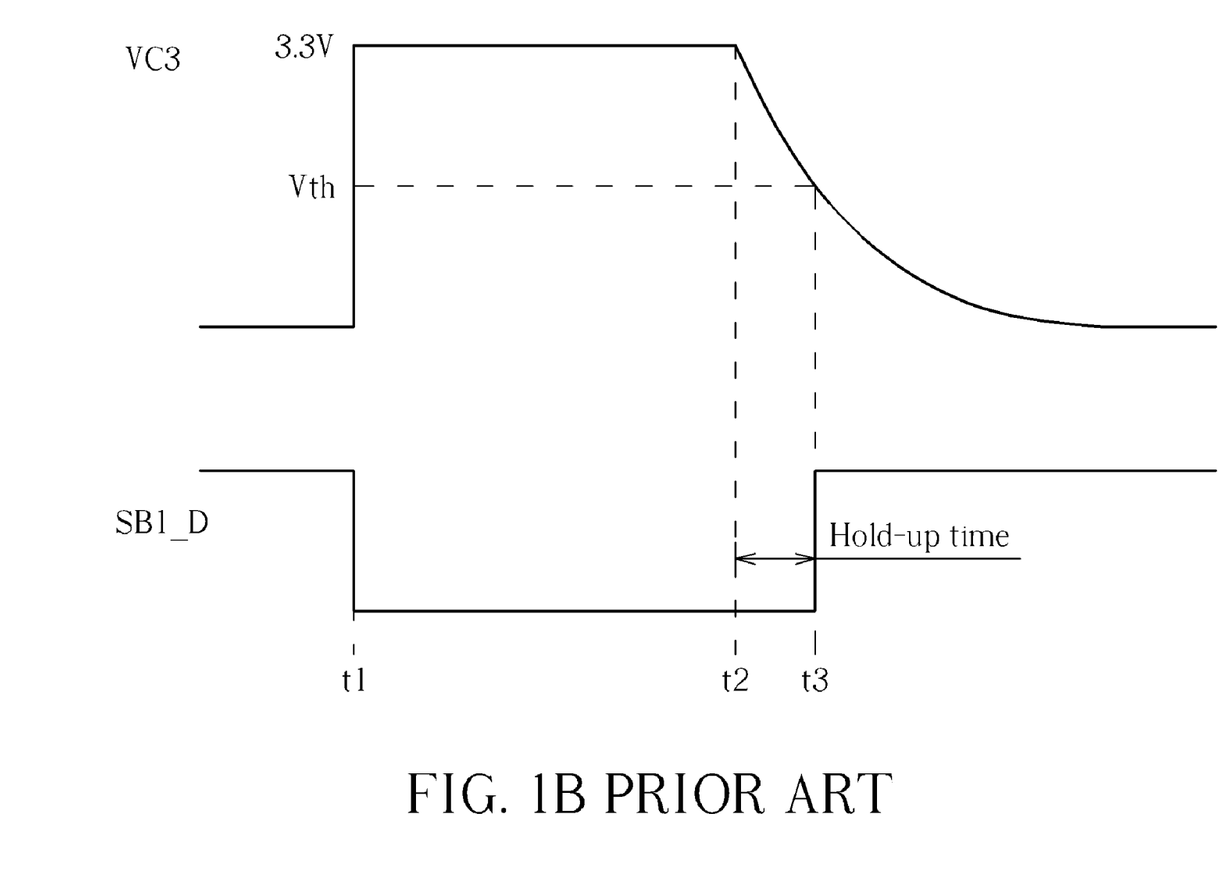
FIG. 1B is a hold-up time diagram in the prior art.

In FIG. 1A, the corresponding signal level of detecting pin B1_D remains for a period of time due the delaying circuit including resistor R3 and capacitor C3. Please refer to FIG. 1B. At time t1, button B1 of button detecting circuit 130 is pressed down, the bias voltage of capacitor C3, VC3, is quickly charged to 3.3V, and switch S3 and switch S4 are turned on. Detecting pin B1_D then generates a detecting signal SB1_D at a logic low level. When the button B1 is released at time t2, the electric charge accumulated on capacitor C3 begins to discharge till bias voltage VC3 of capacitor C3 reduces to lower than the turn-on threshold voltage Vth of switch S4 at time t3. Switch S4 is turned off then, and detecting signal SB1_D transits to the logic high level. Please refer to FIG. 1B. It is observed that the interval between time t2, at which the button B1 is released, and time t3, at which the detecting signal SB1_D transits to the logic high level, is a hold-up time. The hold-up time enables the firmware of the digital camera system to determine which operation mode is the current mode of the camera system according to a one-shot pulse signal and a detecting signal.

However, detecting circuit 100 in FIG. 1A may have problems. For button B1 adopts positive logic operation, that is, the operation of the button is electrically connected to the power, some additional pins connected to the power are required when implementing the detecting circuit in FIG. 1A into integrated circuit. The volume and the size of detecting circuit 100 may increase in accordance.

Besides being a component of the time delaying circuit, capacitor C3 is also utilized to prevent the error function of switch S3 due the abnormal energy injection caused by electrostatic discharge. Therefore, a capacitance larger than 10 uF is usually adopted. For capacitor C3 and resistor R3 are discrete components and the accuracy may not high enough mostly, large variation of hold-up time may be introduced and the reliability of the circuit may decrease.

Besides, the switches are implemented by discrete transistors, such as n-channel metal-oxide-semiconductors (NMOS) or bipolar junction transistors (BJT). Therefore, the threshold voltage of each switch may be different. For the accuracy of components may not be high enough, the transistors may not be turned on under the predetermined voltage. This is called the sub-threshold phenomenon, which enlarges the possibility of wrongly determining the status and modes of the camera system.

In addition to the above problem of reliability, the circuit shown in FIG. 1A has to utilize capacitor C1, resistor R1, capacitor C2 and resistor R2 to form high-pass filters to achieve the need to output one-shot pulse signals. Diodes D1 and D2 are further required to clamp negative voltage generated during the RC charging/discharging, for not damaging the switches and circuit in connected equipments or stages. Therefore, the number of the components of the circuit increases, and so does the cost of the circuit.

SUMMARY OF THE INVENTION

The present invention provides a detecting device for detecting an operating mode. The detecting device comprises a pulse generator for issuing a one-shot pulse signal in response to each of button signals respectively, and a hold-up unit for receiving the button signals to respectively generate delayed button signals by way of clock delay determined by a clock signal. Wherein the one-shot pulse signal and the delayed button signals are used to determine an operating mode of a system.

The present invention further provides a method for detecting an operating mode. The method comprises providing buttons for generating button signals respectively, outputting a one-shot pulse signal in response to anyone of the button signals, generating a delayed button signal corresponding to one of the button signals by way of clock delay determined by a clock signal, and determining an operating mode of a system according to the one-shot pulse signal and the delayed button signal.

These and other objectives of the present invention will no doubt become obvious to those of ordinary skill in the art after reading the following detailed description of the preferred embodiment that is illustrated in the various figures and drawings.

DETAILED DESCRIPTION

The features and advances of the present invention are described in details in the following embodiments. Those skilled in the art will readily understand the content of the present invention and implement it therefore. People skilled in the art can easily comprehend the relevant goal and advances of the present invention according to the specification, the claims and the figures.

The following embodiments are for further explain the present invention but not limiting the scope of the present invention.

Figure 2:
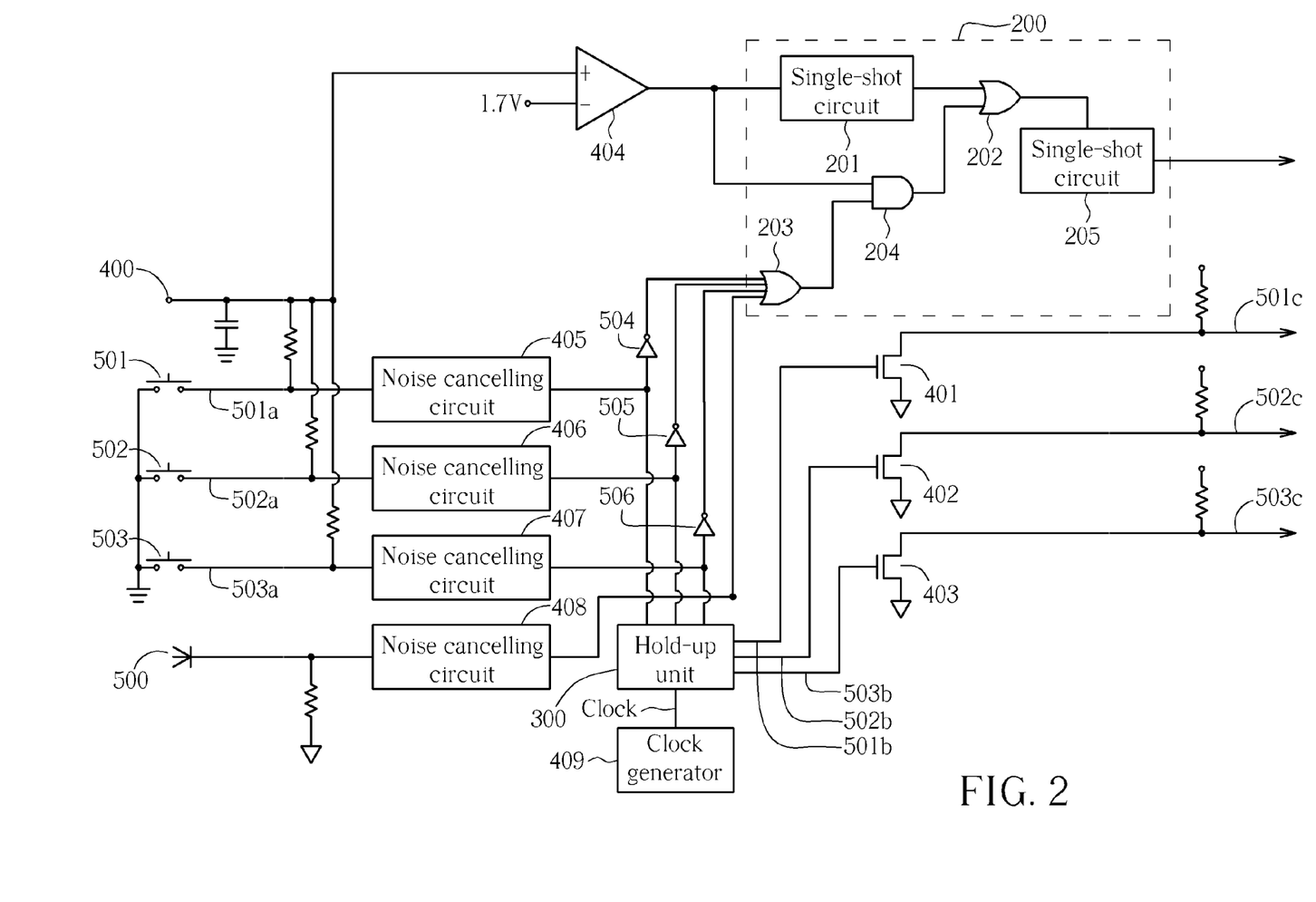
FIG. 2 is a circuit diagram of the detecting device for detecting the operation mode of the present invention.

Please refer FIG. 2. FIG. 2 is a diagram of the detecting device for detecting an operating mode of the present invention. A pulse generator 200 and a hold-up unit 300 are the main components. Pulse generator 200 is utilized to output a one-shot pulse signal in response to a button signal generated by the operation of anyone of buttons 501-503. Hold-up unit 300 is utilized to receive the button signals, and to generate corresponding delayed button signals by way of clock delay determined by a clock signal generated from clock generator 409. The one-shot pulse signal generated by pulse generator 200 and the delayed button signals generated by hold-up unit 300 are utilized to determine the present operating mode of a system. In one embodiment, the system is a camera system or any other kind of system.

In this embodiment, there are three buttons 501, 502 and 503 installed. Each button has one terminal electrically connected to ground. Therefore, when any one of buttons 501-503 is pressed and then released, a button signal of a logic low level is generated then. For pulse generator 200 generating a one-shot pulse signal in response to the button signal accurately, inverters 504, 505 and 506 are installed correspondingly to buttons 501-503, to invert the logic states of the button signals, transitioning from logic low to logic high.

The detecting device of the present embodiment includes a comparator 404, and a voltage source 400 such as a battery. When the battery voltage exceeds a trigger level, for example, 1.7 V in the diagram, the output signal of comparator 404 transits from logic low to logic high, such to trigger single-shot circuit 201 in pulse generator 200. Single-shot circuit 201 then generates a one-shot pulse signal, which is received by logic gate 202, an OR gate in this embodiment. No matter the logic level of the input signal at the other input of logic gate 202, logic gate 202 bypasses the one-shot pulse signal from single-shot circuit 201 to single-shot circuit 205. For the one-shot pulse signal output by the logic gate 202 comprises a rising edge that transits from logic low to logic high, single-shot circuit 205 is triggered to output another one-shot pulse signal.

When any one of buttons 501-503 is pressed and then released, a button signal of a logic low level is generated accordingly. One of inverters 504, 505 and 506 inverts the logic level of the button signal from low to high. As can be derived, in this moment, logic gates 203, 204 and 202 can bypass the button signal to trigger single-shot circuit outputting another one-shot pulse signal.

Besides, when a peripheral device is connected to the USB interface of the system, input 500 receives a detecting signal of logic high level to logic gate 203. The way that pulse generator 200 outputs a one-shot pulse signal is the same as what is mentioned before.

The logic gates in pulse generator 200 described above are for exemplary illustration. For those skilled in the art it is easy and possible to arbitrarily combine logic gates or equal circuits to achieve similar function, such that pulse generator 200 can output a one-shot pulse signal under any of the following situations: (1) any button signal generated; (2) the source voltage higher than a predetermined voltage; and (3) a peripheral device connected to the USB interface of the system.

In the embodiment of FIG. 2, a plurality of noise canceling circuits 405, 406 and 407 are further included. Noise canceling circuits 405, 406 and 407 are electrically connected to buttons 501, 502 and 503 respectively to filter out possible noise coming with button signals. Similarly, a noise canceling circuit 408 may be installed at input 500 to compress interference and noise.

In the embodiment of FIG. 2, a clock signal generator 409 is further included to generate a clock signal CLOCK for hold-up unit 300.

Figure 3A:
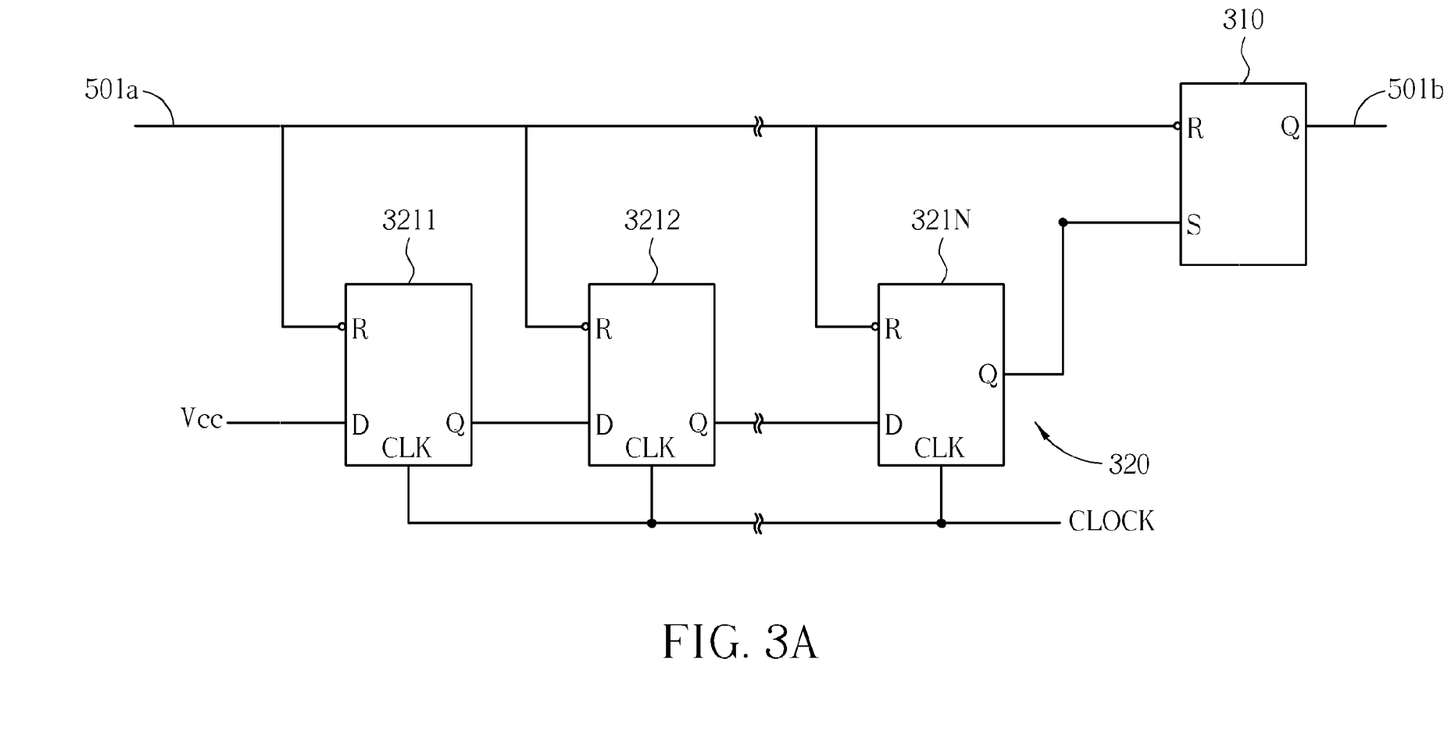
FIG. 3A is a diagram of the hold-up circuit in the present detecting device of the present invention.

Hold-up unit 300 in one embodiment includes three identical hold-up circuits for receiving three button signals respectively to generate three delayed button signals corresponding to the three button signals, respectively. For example, a hold-up circuit is illustrated in FIG. 3A, composed by a latch circuit 310 and a clock delay circuit 320. Latch circuit 310 includes a first input R (reset end) and a second input S (set end), and an output end Q for outputting a corresponding delayed button signal. Clock delay circuit 320 in the present embodiment is implemented by a shift register, including N flip-flops. Input R of the first flip-flop 3211 is for receiving the corresponding button signal, and input D (data input end) of the first flip-flop 3211 is connected to a logic high level signal Vcc, and output Q is connected to input D of the second flip-flop 3212. Output Q of the last flip-flop 321N is connected with input S of the latch circuit 310. Input CLK (clock input) of each flip-flop is utilized to receive clock signal CLOCK generated by a clock generator 409 as shown in FIG. 2.

Figure 3B:
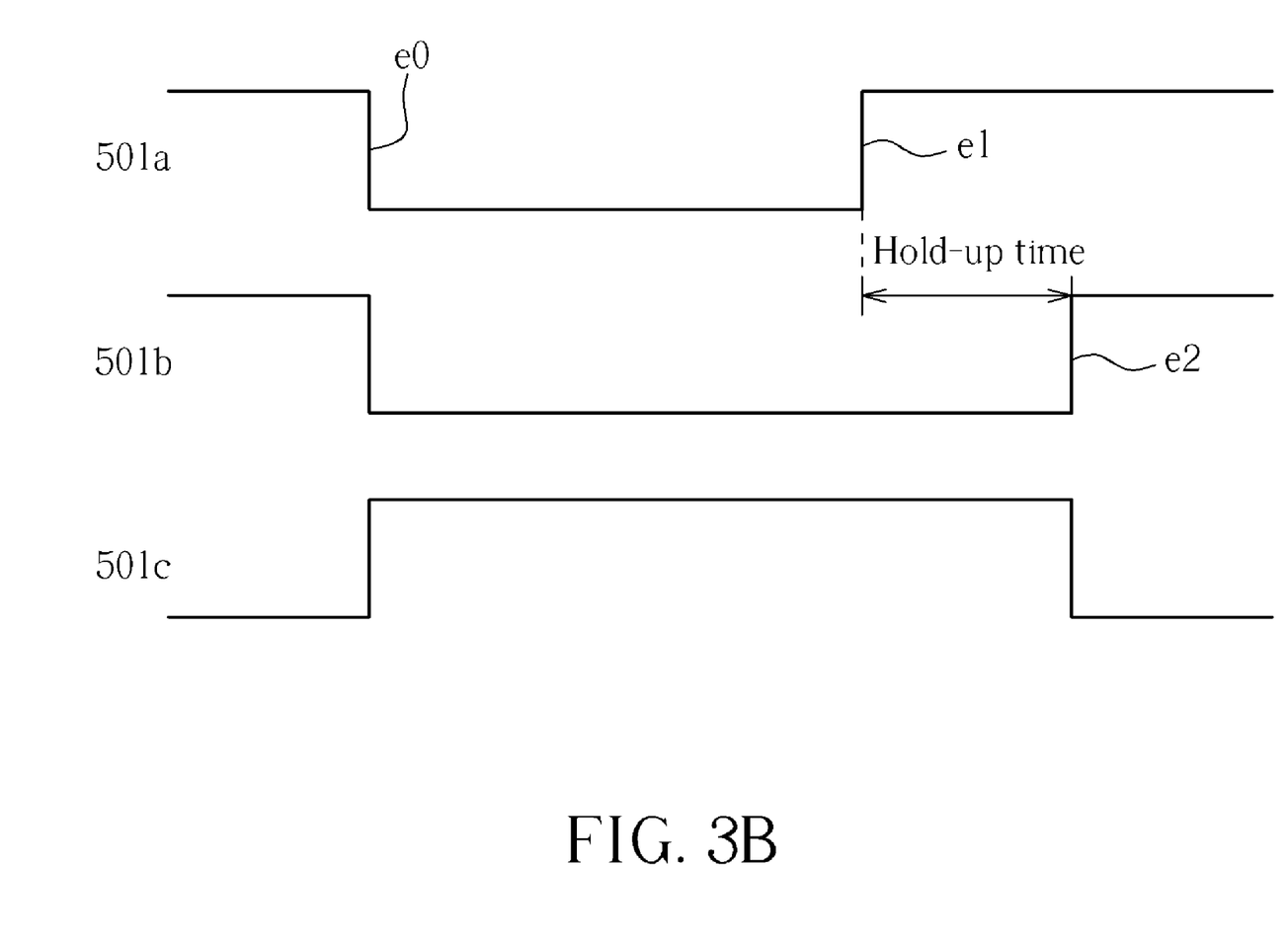
FIG. 3B is a clock diagram of the button signals, delayed button signals, detecting signals and the hold-up time in the present invention.

Please refer to FIG. 2 and FIG. 3A. Taking button 501 for instance, when button 501 is pressed down and then released, a button signal 501a comprising a pulse of logic low level is generated. As illustrated in FIG. 3B, input R of latch circuit 310 is triggered by a falling edge (e0) of the button signal at 501a, such that latch circuit 310 is caused to output and latch a delayed button signal 501b of logic low level at output Q. Similarly, when buttons 502 and 503 are pressed down and then released, button signals 502a and 503a comprising pulses at logic low level are generated respectively.

When the button signal at 501a transits to the logic high level, the clock delay circuit 320 is triggered by the rising edge (e1) of the button signal. After N clocks determined by signal CLOCK, the last flip-flop 321N transmits the logic high level Vcc to input S of latch circuit 310, such that delayed button signal 501b transits to a logic high level.

It is seen from FIG. 3B that, the interval between the rising edge (e1) of button signal 501a and the rising edge (e2) of delayed button signal 501b is a hold-up time. In the embodiment, the hold-up times generated by the three hold-up circuits correspondingly to the three button signals are equal, that is, the time delays are all the same.

Clock delay circuit 320 of the present invention is not limited to a shift register. For example, it is also possible to implement the clock delay circuit 320 with an additional frequency divider. In this way, less serial flip-flops are required to achieve a longer hold-up time.

In the embodiment, the numbers of latch circuits 310 and clock delay circuits 320 are dependent on the number of the buttons. For instance, when there are three operation buttons, three sets of latch circuits and three sets of clock delay circuits may be necessary to be installed.

Figure 4:
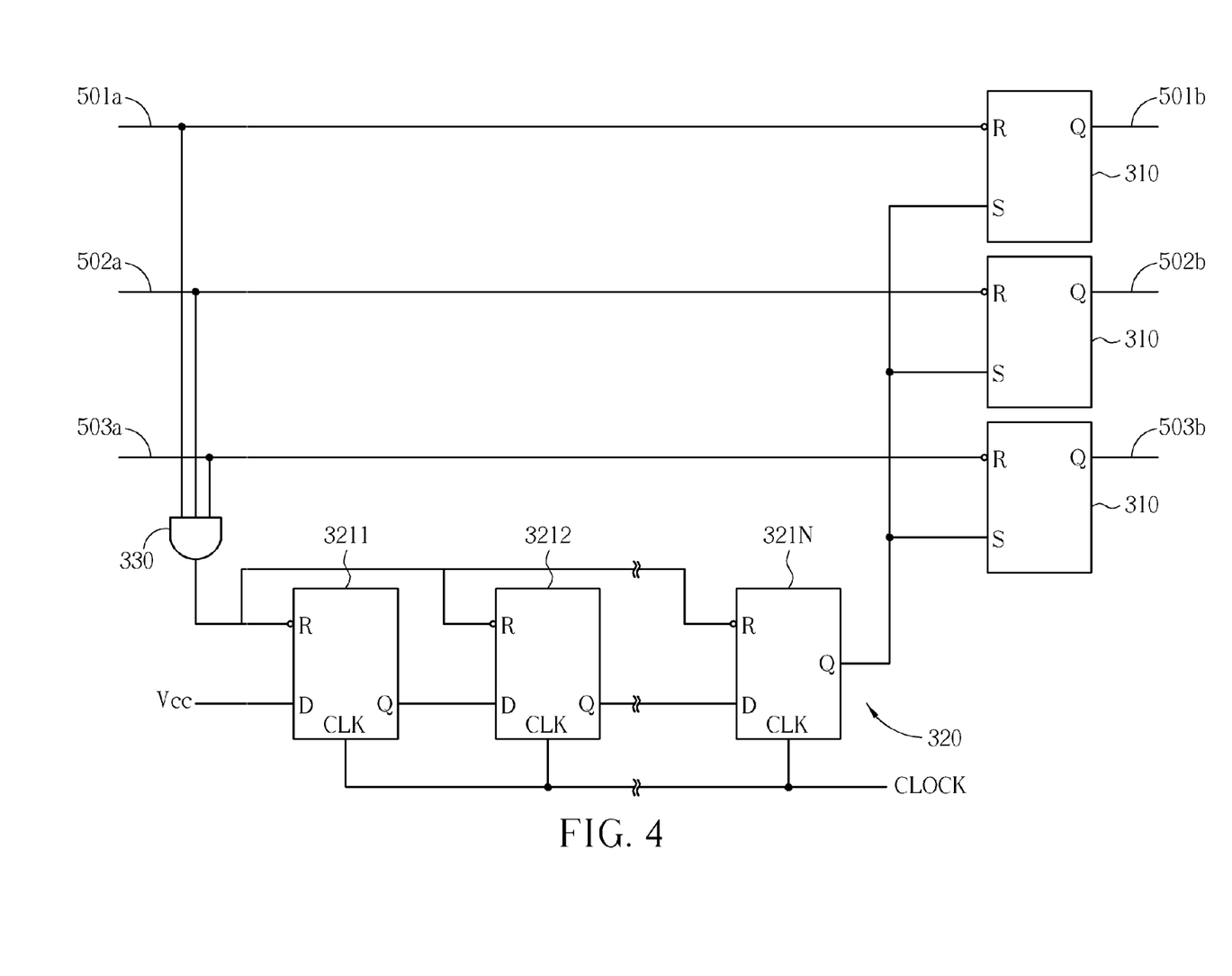
FIG. 4 is a hold-up circuit in another embodiment of the present invention.

In another embodiment, no matter the number of latch circuits 310, it is possible to install only one set of clock delay circuit 320 to share, as illustrated in FIG. 4. However, an AND gate 330 is needed to install.

In the embodiment shown in FIG. 2, switches 401, 402 and 403 are further included to receive delayed button signals 501b, 502b and 503b output by hold-up unit 300, respectively, in order to output corresponding detecting signals 501c, 502c and 503c. In one embodiment, when button 501, for example, is pressed down and then released, a detecting signal 501c as shown in FIG. 2 is generated then. The system may then determine the present operating mode according to a one-shot pulse signal and a detecting signal.

The detecting circuit for detecting the status disclosed by the present invention may be integrated into a chip. Please refer to FIG. 5. When the present detecting circuit is integrated into a chip, a plurality of pins may be installed. For example, pins 511, 512, 513, 514 and 515 are for receiving input signals; the pin 511 for receiving power signals, the pins 512, 513 and 514 for receiving a button signal, and the pin 515 for receiving a detecting signal whether a peripheral device is connected to the USB interface. Pin 516 is utilized to output the one-shot pulse signal output by pulse generator 200. Each of pins 517, 518 and 519 is used to output a detecting signal corresponding to a button signal.

Figure 6:
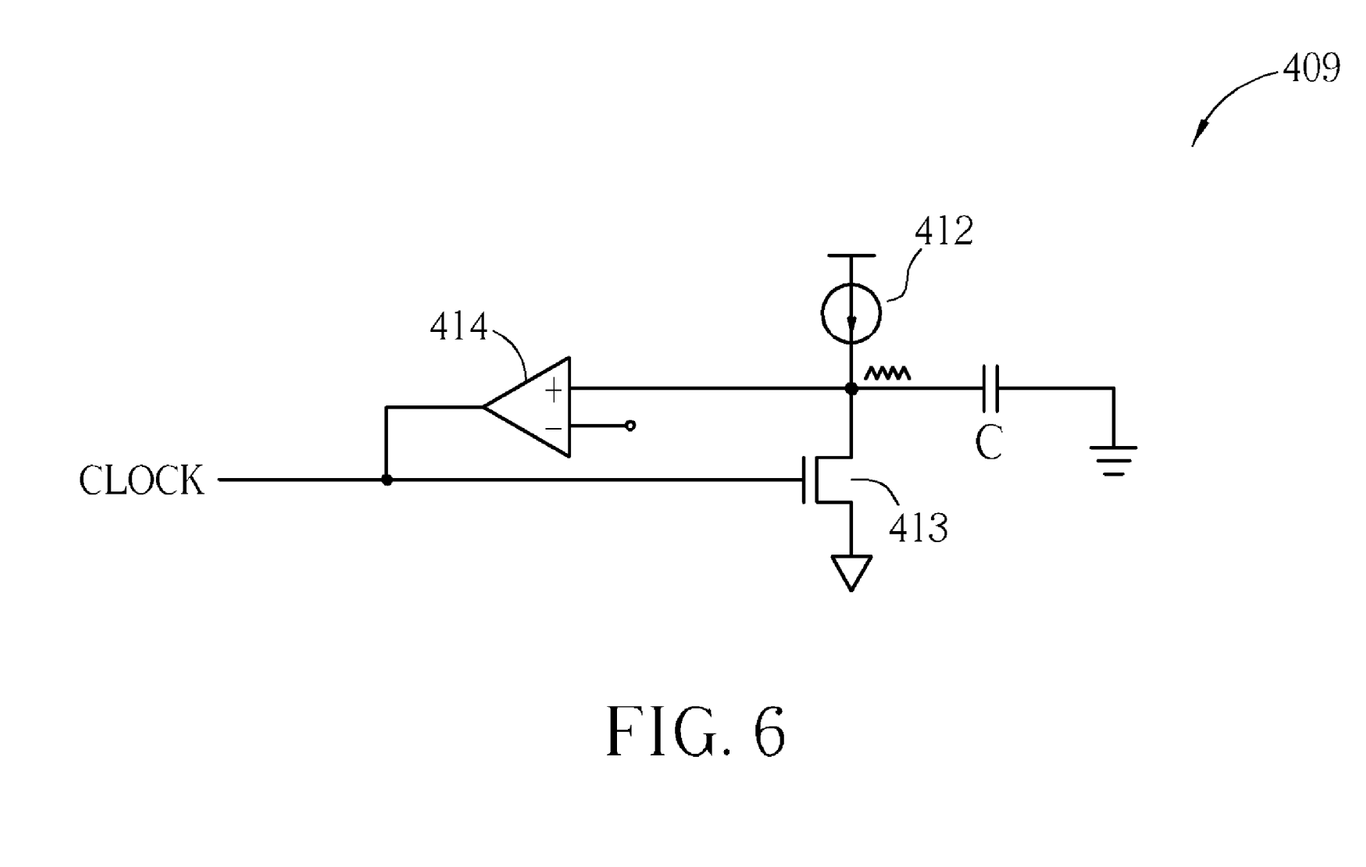
FIG. 6 is a clock generator of the detecting device of the present invention.

Please refer FIG. 6, a circuit diagram of an embodiment of clock generator 409 of the present invention. Clock generator 409 includes a current source 412, a switch 413, a comparator 414 and a capacitor C. Current source 412 is utilized to charge capacitor C. When switch 413 turns off, the current source 412 charges capacitor C. When switch 413 turns on, the charge accumulated on capacitor C is quickly discharged to the ground, such that a triangle voltage wave is generated by capacitor C. Comparator 414 compares the signal of the triangle voltage wave to a predetermined voltage to output clock signal CLOCK with a predetermined frequency, which may be adjusted by changing the capacitance value of capacitor C.

Figure 5:
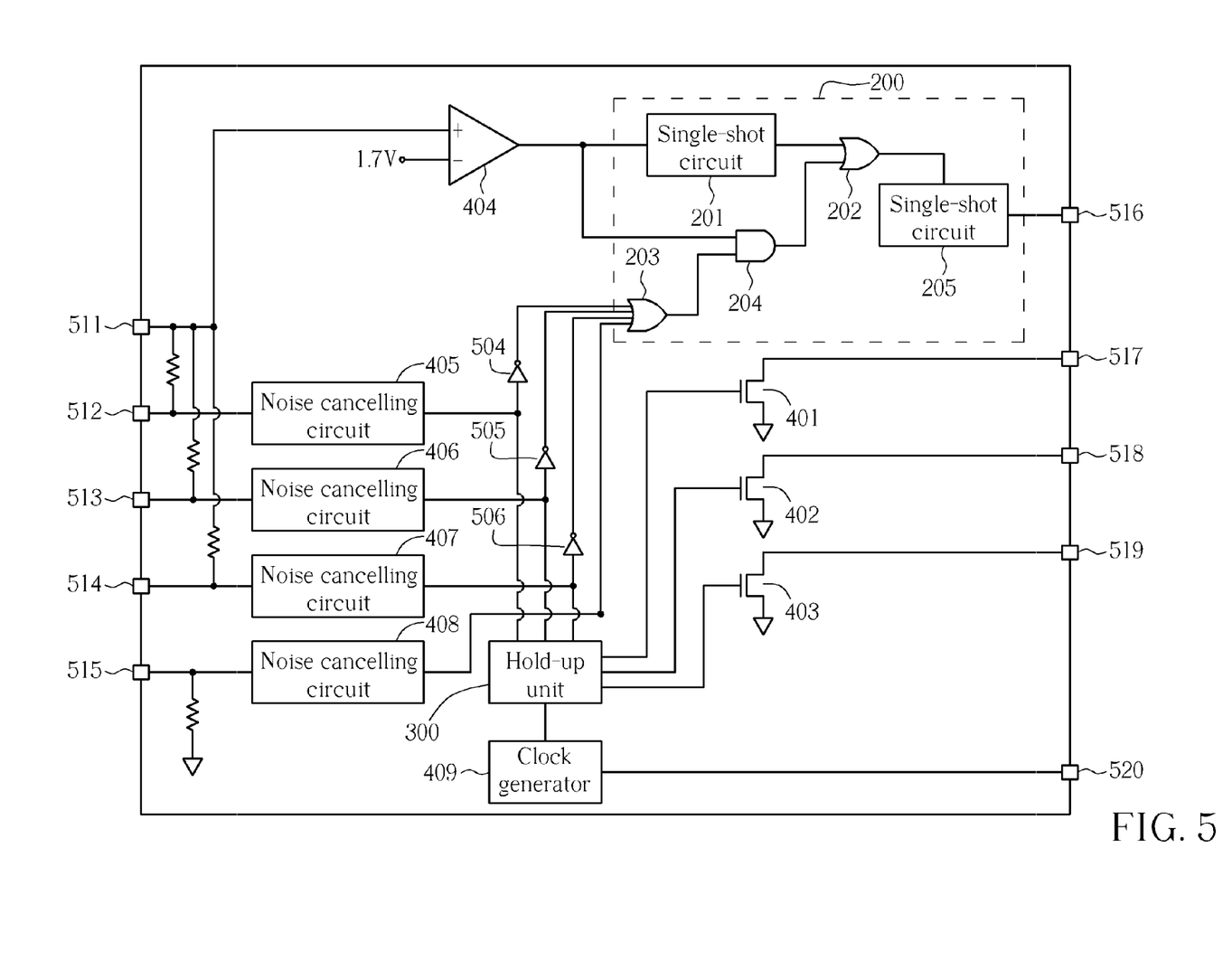
FIG. 5 is a diagram illustrating the integration of the detecting circuit of the present invention into a chip.

In the embodiment shown in FIG. 5, capacitor C may be installed outside the chip, connected to the pin 520.

According to the embodiment of the present invention, as the button is operated by negative logic, it is not necessary to adopt an additional pin to 3.3 V when the circuit is integrated into an IC. Hence the space of a pin is saved.

Besides, by the noise canceling circuit, the mechanism to eliminate noise and interference can be installed within the circuit to prevent the error function of the circuit caused by the abnormal energy injection during the electrostatic discharge (ESD) testing.

According to the embodiment of the present invention, the hold-up time of the detecting signal may be adjusted, and only smaller capacitors are required. In usual cases, capacitance of 10 nF is enough to achieve the time delay constant. Besides, the variation of the hold-up time can be limited to 10%. In the conventional circuit in FIG. 1, the variation is possible to exceed 50%.

When implementing the embodiments disclosed by the present invention in chips, the whole stand-by current of the IC is not over 5 μA. The consuming power is reduced substantially therefore.

Those skilled in the art will readily observe that numerous modifications and alterations of the device and method may be made while retaining the teachings of the invention.

What is claimed is:

1. A detecting device for detecting an operating mode, comprising:
    a pulse generator, for issuing a one-shot pulse signal in response to each of a plurality of button signals respectively; and
    a hold-up unit, for receiving the button signals to respectively generate delayed button signals by way of clock delay determined by a clock signal, each delayed button signal uniquely corresponding to one of the button signals, wherein the hold-up unit comprises hold-up circuits, respectively receiving the button signals and generating the delayed button signals, wherein one of the hold-up circuits comprises:
        a latch circuit, for generating a corresponding delayed button signal, wherein one input of the latch circuit is able to be triggered by a first edge of a corresponding button signal such that a level of the corresponding delayed button signal is changed to and latched at a first level; and
        a clock delay circuit for receiving the clock signal, wherein, after the clock delay circuit is triggered by a second edge of the corresponding button signal and a predetermined time period determined by the clock signal has elapsed, the clock delay circuit triggers another input of the latch circuit to change the level of the corresponding delayed button signal to a second level;
    wherein the one-shot pulse signal and the delayed button signals are used to determine an operating mode of a system.

2. The detecting device of claim 1, further comprising switches, respectively receiving the delayed button signals to output detecting signals, wherein the one-shot pulse signal and the detecting signals are used to determine an operating mode of the system.

3. The detecting device of claim 1, wherein the clock delay circuit comprises at least a flip-flop.

4. The detecting device of claim 1, further comprising a clock generator for generating the clock signal.

5. The detecting device of claim 1, wherein the clock delay circuit is a shift register.

6. The detecting device of claim 1, wherein the clock delay circuit is a frequency divider.

7. The detecting device of claim 1, wherein the system is a camera system.

8. The detecting device of claim 1, being implemented within an integrated circuit (IC).

9. The detecting device of claim 1, further comprising a comparator, wherein when a voltage of a power source for the detecting device confirms with a predetermined requirement, the comparator makes the pulse generator output a corresponding one-shot pulse signal.

10. The detecting device of claim 1, further comprising noise canceling circuits for canceling signal noise of the button signals respectively.

11. The detecting device of claim 1, wherein the delay time periods between the delayed button signals and corresponding button signals are identical.

12. The detecting device of claim 1, further comprising an input for receiving a detecting signal indicating a peripheral device is connected to a Universal Serial Bus (USB) interface.

13. The detecting device of claim 12, wherein the detecting signal further causes the pulse generator to output the one-shot pulse signal.

14. A method for detecting an operating mode, comprising:
providing buttons for generating button signals respectively;
outputting a one-shot pulse signal in response to anyone of the button signals;
generating a delayed button signal corresponding to one of the button signals by way of clock delay determined by a clock signal, each delayed button signal uniquely corresponding to one of the button signals, wherein the step of generating the delayed button signal comprises:
providing a latch circuit to generate the delayed button signal;
triggering the latch circuit by a first edge of the button signal to make a level of the delayed button signal changed to and latched at a first level;
providing a clock delay circuit for receiving the clock signal;
triggering the clock delay circuit by a second edge of the button signal; and
after the clock delay circuit is triggered by the button signal and a predetermined time period determined by the clock signal has elapsed, triggering the latch circuit to change the level of the delayed button signal to a second level; and
determining an operating mode of a system according to the one-shot pulse signal and the delayed button signal.

* * * * *